United States Patent
Kuwahara et al.

(10) Patent No.: US 8,268,270 B1
(45) Date of Patent: Sep. 18, 2012

(54) COATING SOLUTION FOR FORMING A LIGHT-ABSORBING LAYER OF A CHALCOPYRITE SOLAR CELL, METHOD OF PRODUCING A LIGHT-ABSORBING LAYER OF A CHALCOPYRITE SOLAR CELL, METHOD OF PRODUCING A CHALCOPYRITE SOLAR CELL AND METHOD OF PRODUCING A COATING SOLUTION FOR FORMING A LIGHT-ABSORBING LAYER OF A CHALCOPYRITE SOLAR CELL

(75) Inventors: Masaru Kuwahara, Hillsboro, OR (US); Koichi Misumi, Hillsboro, OR (US); Hidenori Miyamoto, Hillsboro, OR (US)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/157,922

(22) Filed: Jun. 10, 2011

(51) Int. Cl.
| | |
|---|---|
| C01F 1/00 | (2006.01) |
| C01F 3/00 | (2006.01) |
| C01F 7/00 | (2006.01) |
| C01G 15/00 | (2006.01) |
| C22B 21/00 | (2006.01) |
| C22B 35/00 | (2006.01) |
| C22B 58/00 | (2006.01) |
| C22B 61/00 | (2006.01) |
| B01J 8/02 | (2006.01) |
| H01L 31/00 | (2006.01) |
| H01M 6/30 | (2006.01) |
| F21V 9/00 | (2006.01) |
| G02B 5/02 | (2006.01) |
| G02C 7/10 | (2006.01) |

(52) U.S. Cl. ........ 423/111; 136/243; 136/252; 136/262; 136/264; 136/265; 423/1; 423/122; 423/508; 423/659; 429/111; 252/582

(58) Field of Classification Search .............. 429/111; 136/243, 252, 262, 264, 265; 423/1, 111, 423/122, 508, 659; 252/582

See application file for complete search history.

(56) References Cited

U.S. PATENT DOCUMENTS 6,379,585 B1    4/2002    Vecht et al.
(Continued)

FOREIGN PATENT DOCUMENTS

| CN | 101471394 | * 12/2007 |
|---|---|---|
| EP | 2234168 | * 9/2010 |
| JP | A-2005-051224 | 2/2005 |

(Continued)

OTHER PUBLICATIONS

International Search Report issued in PCT/JP2012/064799 on Jul. 10, 2012.

*Primary Examiner* — Patrick Ryan
*Assistant Examiner* — Aaron Greso
(74) *Attorney, Agent, or Firm* — Knobbe, Martens, Olson & Bear LLP

(57) ABSTRACT

A coating solution for forming a light-absorbing layer of a chalcopyrite solar cell, including a hydrazine-coordinated Cu chalcogenide complex, a hydrazine-coordinated In chalcogenide complex and hydrazine-coordinated Ga chalcogenide complex dissolved in dimethylsulfoxide, the hydrazine-coordinated Cu chalcogenide complex being obtained by dissolving Cu or $Cu_2Se$ and a chalcogen in dimethylsulfoxide having hydrazine added, and adding a poor solvent to the resulting solution.

10 Claims, 1 Drawing Sheet

U.S. PATENT DOCUMENTS

| | | |
|---|---|---|
| 7,094,651 B2 | 8/2006 | Mitzi et al. |
| 7,341,917 B2 | 3/2008 | Milliron et al. |
| 7,618,841 B2 | 11/2009 | Mitzi et al. |
| 2005/0009229 A1 | 1/2005 | Mitzi |
| 2008/0299033 A1* | 12/2008 | Caldwell et al. .............. 423/508 |
| 2009/0145482 A1 | 6/2009 | Mitzi et al. |

FOREIGN PATENT DOCUMENTS

| | | |
|---|---|---|
| JP | A-2010-530624 | 9/2010 |
| JP | A-2011-091228 | 5/2011 |
| WO | WO 2008/057119 | 5/2008 |
| WO | WO 2008/063190 | 5/2008 |
| WO | WO 2008/155251 | 12/2008 |

* cited by examiner

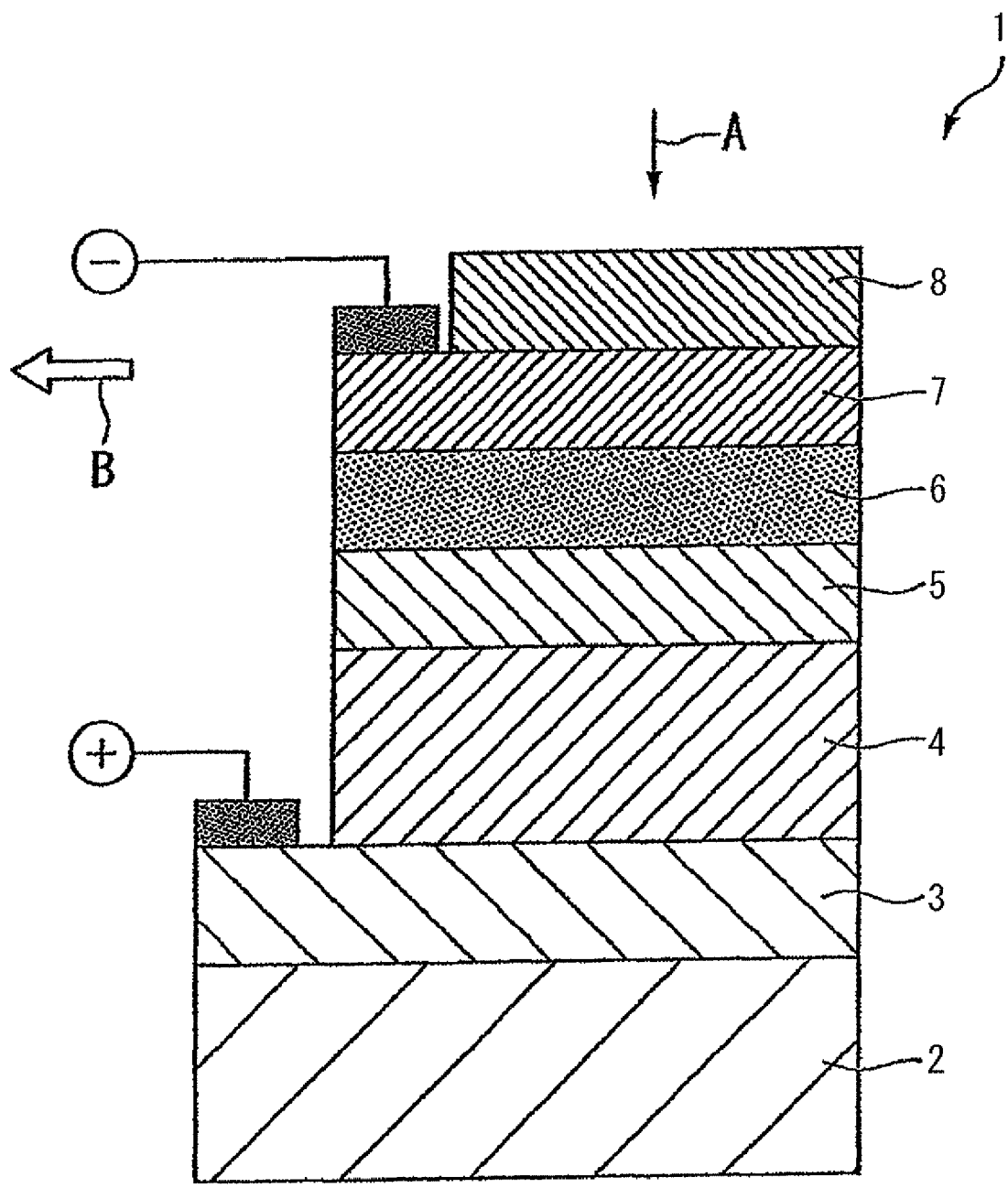

COATING SOLUTION FOR FORMING A LIGHT-ABSORBING LAYER OF A CHALCOPYRITE SOLAR CELL, METHOD OF PRODUCING A LIGHT-ABSORBING LAYER OF A CHALCOPYRITE SOLAR CELL, METHOD OF PRODUCING A CHALCOPYRITE SOLAR CELL AND METHOD OF PRODUCING A COATING SOLUTION FOR FORMING A LIGHT-ABSORBING LAYER OF A CHALCOPYRITE SOLAR CELL

TECHNICAL FIELD

The present invention relates to a coating solution for forming a light-absorbing layer of a chalcopyrite solar cell, a method of producing a light-absorbing layer of a chalcopyrite solar cell, a method of producing a chalcopyrite solar cell and a method of producing a coating solution for forming a light-absorbing layer of a chalcopyrite solar cell.

BACKGROUND ART

In recent years, due to concerns about the environment, solar cells have been attracting a growing interest. In particular, attention has been drawn to chalcopyrite solar cells which are thin-film solar cells with high photoelectric conversion efficiency, and research and development have been actively conducted.

A chalcopyrite solar cell is produced by forming a light-absorbing layer prepared from a chalcopyrite material on a substrate. Representative elements of a chalcopyrite material include copper (Cu), indium (In), gallium (Ga), selenium (Se) and sulfur (S). Representative examples of the light-absorbing layer include $Cu(In,Ga)Se_2$ and $Cu(In,Ga)(Se,S)_2$, which are referred to as CIGS and CIGSS, respectively.

FIG. 1 is a schematic cross-sectional diagram of an example of a chalcopyrite solar cell.

As shown in FIG. 1, a chalcopyrite solar cell has a basic structure in which a first electrode 3, a CIGS layer 4 (light-absorbing layer), a buffer layer 5, an i-ZnO layer 6 and a second electrode 7 are laminated on a substrate 2 in this order. As the buffer layer, for example, a CdS layer, an ZnS layer and an InS layer are known.

Each of the first electrode 3 and the second electrode 7 has a terminal connected thereto, and each of the terminals is connected to a wire. In such a chalcopyrite solar cell 1, an incident light entering in the A direction is absorbed by the CIGS layer 4 to generate an electromotive force, and an electric current flows in the B direction.

The surface of the second electrode 7 is covered with an antireflection film layer 8 composed of, for example $MgF_2$.

As a method of forming a CIGS layer 4, a sputtering method and a coating method are known. However, when a sputtering method is used, the apparatus has to be scaled up, which resulted in deterioration of the yield. For this reason, diligent studies have been made on the coating method which enables production at a relatively low cost.

Generally, in a coating method, elements such as Cu, In, Ga, Se and S are dissolved in a specific solvent to prepare a coating solution, and the coating solution is applied to a substrate by a spin coating method or a dipping method, followed by baking, thereby forming a CIGS layer.

In the preparation of a coating solution, there are known a method in which hydrazine is used as the solvent, and a method in which amine is added as a dissolution promoter instead of using hydrazine.

DOCUMENTS OF RELATED ART

Patent Document

[Patent Document 1] U.S. Pat. No. 7,094,651
[Patent Document 2] U.S. Pat. No. 7,341,917
[Patent Document 3] U.S. Pat. No. 7,618,841
[Patent Document 4] U.S. Publication No. 2009/0145482
[Patent Document 5] WO2008/057119
[Patent Document 6] WO2008/063190

SUMMARY OF THE INVENTION

However, in the preparation of a coating solution, when hydrazine is used as the solvent, a problem has conventionally been raised in terms of safety of the process due to chemical properties (explosiveness) of hydrazine.

Further, when hydrazine is used as the coating solvent, a problem arises in that copper selenide ($Cu_2Se$) is precipitated after about 2 weeks from the preparation of the coating solution, such that the storage period of the coating solution becomes short.

In view of these problems, there have been demands for a coating solution which can assure safety of process and have storage stability over a long time. However, such a coating solution has not been proposed under these circumstances.

For solving the above-mentioned problems, the present invention employs the following embodiments.

The coating solution of the present invention is used for forming a light-absorbing layer of a chalcopyrite solar cell, and includes a hydrazine-coordinated Cu chalcogenide complex, a hydrazine-coordinated In chalcogenide complex and a hydrazine-coordinated Ga chalcogenide complex dissolved in dimethylsulfoxide, the hydrazine-coordinated Cu chalcogenide complex being obtained by dissolving Cu or $Cu_2Se$ and a chalcogen in dimethylsulfoxide having hydrazine added, and adding a poor solvent to the resulting solution.

Further, the method of producing a coating solution according to the present invention is a method of producing a coating solution used for forming a light-absorbing layer a chalcopyrite solar cell, and includes obtaining a hydrazine-coordinated Cu chalcogenide complex by dissolving Cu or $Cu_2Se$ and a chalcogen in dimethylsulfoxide having hydrazine added, and adding a poor solvent to the resulting solution, followed by dissolving a hydrazine-coordinated Cu chalcogenide complex in dimethylsulfoxide to obtain a solution (I), dissolving a hydrazine-coordinated In chalcogenide complex in dimethylsulfoxide to obtain a solution (II), dissolving a hydrazine-coordinated Ga chalcogenide complex in dimethylsulfoxide to obtain a solution (III), and mixing together the solution (I), the solution (II) and the solution (III).

Furthermore, the method of producing a coating solution for forming a light-absorbing layer according to the present invention includes obtaining a hydrazine-coordinated Cu chalcogenide complex by dissolving Cu or $Cu_2Se$ and a chalcogen in dimethylsulfoxide having hydrazine added, and adding a poor solvent to the resulting solution, followed by dissolving the hydrazine-coordinated Cu chalcogenide complex in dimethylsulfoxide to obtain a solution (I'), dissolving a hydrazine-coordinated In chalcogenide complex and a hydrazine-coordinated Ga chalcogenide complex in dimethylsulfoxide to obtain a solution (II'), and mixing together the solution (I') and the solution (II').

In the present invention, since Cu, In and Ga are dissolved in not hydrazine but dimethylsulfoxide (DMSO), there is no need to use dangerous hydrazine in the application of the coating solution. As a result, safety of the process in the formation of a light-absorbing layer can be assured. Further, the coating solution for forming a light-absorbing layer according to the present invention has no precipitation of Cu$_2$Se. Therefore, the coating solution exhibits an excellent storage stability.

BRIEF DESCRIPTION OF THE DRAWINGS

FIG. 1 is a schematic cross-sectional diagram of an example of a chalcopyrite solar cell.

DETAILED DESCRIPTION OF THE INVENTION

First Embodiment

Hereafter, the coating solution for forming a light-absorbing layer according to a first embodiment of the present invention will be described.

The coating solution for forming a light-absorbing layer according to the present embodiment is obtained by dissolving a hydrazine-coordinated Cu chalcogenide complex, a hydrazine-coordinated In chalcogenide complex and a hydrazine-coordinated Ga chalcogenide complex in dimethylsulfoxide (DMSO), the hydrazine-coordinated Cu chalcogenide complex being obtained by dissolving Cu or Cu$_2$Se and a chalcogen in dimethylsulfoxide having hydrazine added, and adding a poor solvent to the resulting solution.

The coating solution forming a light-absorbing layer is preferably free of amine solvents.

The hydrazine-coordinated Cu chalcogenide complex is obtained by dissolving a Cu metal and a chalcogen in DMSO having hydrazine added thereto, and adding a poor solvent to the resulting solution, followed by recrystallization.

More specifically, a Cu metal and a chalcogen are dissolved in DMSO having hydrazine added thereto, and stirred at room temperature for about 3 to 7 days. Then, hydrazine is removed from the resulting solution while flowing nitrogen, followed by filtration. Thereafter, a poor solvent is added to the filtrate to perform a recrystallization, thereby obtaining a black hydrazine-coordinated Cu chalcogenide complex.

As the chalcogen, Se or S can be used, and Se is preferable. As Cu, not only a Cu metal, but also copper selenide (Cu$_2$Se) may be used. As the poor solvent, an alcohol solvent is preferable, and isopropanol (IPA) is more preferable.

As hydrazine, anhydrous hydrazine may be used, although hydrazine monohydrate is preferable. Anhydrous hydrazine vigorously reacts with selenium, whereas hydrazine monohydrate mildly reacts with selenium. Therefore, hydrazine monohydrate is preferable in terms of ease in handling in the synthesis process.

With respect to the amount of Cu and the chalcogen, it is preferable to use 2 to 4 mol of the chalcogen, per 1 mol of Cu. Further, it is preferable to dissolve Cu and the chalcogen in DMSO having about 2 mol of hydrazine added thereto.

The generation of the hydrazine-coordinated Cu chalcogenide complex described above can be expressed by a chemical formula (1) shown below.

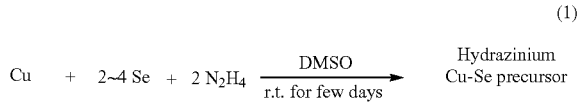

(1)

As described above, in the present embodiment, the hydrazine-coordinated Cu chalcogenide complex is obtained by dissolving the raw materials in DMSO, followed by recrystallization. As a result, the thus obtained hydrazine-coordinated Cu chalcogenide complex is extremely soluble in a DMSO solution.

Next, the hydrazine-coordinated In chalcogenide complex will be described. The hydrazine-coordinated In chalcogenide complex used in this embodiment is required to be generated so as to be soluble in DMSO. The hydrazine-coordinated In chalcogenide complex can be generated, for example, by adding In selenide (In$_2$Se$_3$) and a chalcogen in hydrazine to obtain a crude product (a first crude product), extracting the crude product with DMSO, adding a poor solvent to the resulting solution, followed by reprecipitation.

More specifically, In selenide and a chalcogen are added to hydrazine, and stirred at room temperature for about 3 to 7 days. Then, hydrazine is removed from the resulting solution while flowing nitrogen to obtain a crude product. Thereafter, the obtained crude product is extracted with DMSO.

Subsequently, the extraction solution obtained by extracting the crude product is subjected to filtration using, for example, a 0.2 μm PTFE filter, followed by concentration. Then, a poor solvent is added to the concentration solution to perform a reprecipitation, and the supernatant is removed. The precipitate is washed with IPA and dried, thereby obtaining a dark-red hydrazine-coordinated In chalcogenide complex.

The generation of the hydrazine-coordinated In chalcogenide complex described above can be expressed by a chemical formula (2) shown below.

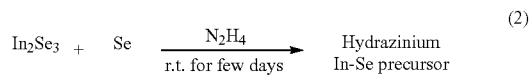

(2)

As the chalcogen, Se or S can be used, and Se is preferable. As In, not only In selenide, but also In metal may be used. As the poor solvent, an alcohol solvent is preferable, and IPA is more preferable. As hydrazine, anhydrous hydrazine may be used, although hydrazine monohydrate is preferable. With respect to the amount of In selenide (In$_2$Se$_3$) and the chalcogen, it is preferable to use 1 mol or more of the chalcogen, per 1 mol of In selenide.

As described above, in the present embodiment, the hydrazine-coordinated In chalcogenide complex is obtained by extracting with a DMSO solution, followed by reprecipitation. As a result, the thus obtained hydrazine-coordinated In chalcogenide complex exhibits improved solubility in a DMSO solution.

Next, the hydrazine-coordinated Ga chalcogenide complex will be described. The hydrazine-coordinated Ga chalcogenide complex used in this embodiment is required to be generated so as to be soluble in DMSO. The hydrazine-coordinated Ga chalcogenide complex can be generated, for example, by adding Ga metal and a chalcogen in hydrazine to obtain a crude product (a second crude product), extracting the crude product with DMSO, adding a poor solvent to the resulting solution, followed by reprecipitation.

More specifically, Ga metal and a chalcogen are added to hydrazine, and stirred at room temperature for about 7 days. Then, hydrazine is removed from the resulting solution while flowing nitrogen to obtain a crude product. Thereafter, the obtained crude product is extracted with DMSO.

Subsequently, the extraction solution obtained by extracting the crude product is subjected to filtration using, for example, a 0.2 μm PTFE filter, followed by concentration. Then, a poor solvent is added to the concentration solution to perform a reprecipitation, and the supernatant is removed. The precipitate is washed with IPA and dried, thereby obtaining a dark-brown hydrazine-coordinated Ga chalcogenide complex.

The generation of the hydrazine-coordinated Ga chalcogenide complex described above can be expressed by a chemical formula (3) shown below.

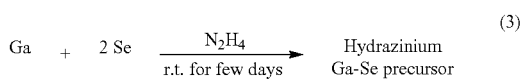

$$\text{Ga} + 2\text{Se} \xrightarrow[\text{r.t. for few days}]{N_2H_4} \text{Hydrazinium Ga-Se precursor} \quad (3)$$

As the chalcogen, Se or S can be used, and Se is preferable. As the poor solvent, an alcohol solvent is preferable, and IPA is more preferable. As hydrazine, anhydrous hydrazine may be used, although hydrazine monohydrate is preferable. With respect to the amount of Ga and the chalcogen, it is preferable to use 2 mol or more of the chalcogen, per 1 mol of Ga.

As described above, in the present embodiment, the hydrazine-coordinated Ga chalcogenide complex is obtained by extracting with a DMSO solution, followed by reprecipitation. As a result, the thus obtained hydrazine-coordinated Ga chalcogenide complex exhibits improved solubility in a DMSO solution.

Next, the method of producing the coating solution for forming a light-absorbing layer will be described.

Firstly, DMSO is added to the aforementioned hydrazine-coordinated Cu chalcogenide complex and stirred at room temperature for about one night, thereby obtaining a DMSO solution having the hydrazine-coordinated Cu chalcogenide complex dissolved therein (solution (I)).

Further, DMSO is added to the aforementioned hydrazine-coordinated In chalcogenide complex and stirred at a temperature of 80 to 120° C. for about 1 hour, thereby obtaining a DMSO solution having the hydrazine-coordinated In chalcogenide complex dissolved therein (solution (II)).

Furthermore, DMSO is added to the aforementioned hydrazine-coordinated Ga chalcogenide complex and stirred at a temperature of 80 to 120° C. for about 1 hour, thereby obtaining a DMSO solution having the hydrazine-coordinated Ga chalcogenide complex dissolved therein (solution (III)).

Subsequently, the DMSO solution having the hydrazine-coordinated Cu chalcogenide complex dissolved therein, the DMSO solution having the hydrazine-coordinated In chalcogenide complex dissolved therein and the DMSO solution having the hydrazine-coordinated Ga chalcogenide complex dissolved therein are mixed together.

In this manner, the coating solution for forming a light-absorbing layer according to the present embodiment can be produced.

In the present embodiment, DMSO is used as the solvent. As a result, the storage stability is improved as compared to a conventional coating solution.

Specifically, when hydrazine is used by a conventional method, a problem arises in that $Cu_2Se$ is precipitated. For example, when hydrazine is used as a solvent, and a solution (I) prepared from $Cu_2S$ and S and a solution (II) prepared from $In_2Se_3$, Ga and Se are mixed together, $Cu_2S$ in the first solution reacts with Se in the second solution to cause the precipitation. The precipitation of $Cu_2S$ was observed after about 2 weeks.

In contrast, the coating solution for forming a light-absorbing layer according to the present embodiment was not deteriorated even after 1 month, meaning that the coating solution exhibited excellent storage stability.

Further, since the coating solution itself does not contain hydrazine, the chemical properties (explosiveness) of hydrazine in the formation of a light-absorbing layer would not be of any problems, thereby improving the safety of the production process.

Furthermore, the coating solution for forming a light-absorbing layer according to the present embodiment contains no amines as a dissolution promoter. As a result, the PV performance was improved as compared to conventional coating solutions.

More specifically, when amines are used as a dissolution promoter, the amines remain in the device after formation of the film, thereby deteriorating the PV (photovoltaic) performance. In contrast, since the coating solution for forming a light-absorbing layer according to the present embodiment does not use any amines as a dissolution promoter, the PV performance is not deteriorated.

In the coating solution for forming a light-absorbing layer according to the present embodiment, if desired, a miscible additive may be included as long as the effects of the present invention are not impaired, for example, an organic solvent for adjusting the viscosity, an additive resin for improving the performance of the film, a surfactant for improving the applicability or a stabilizer.

Next, a method of producing a chalcopyrite solar cell according to the present embodiment will be described.

The method of producing a chalcopyrite solar cell according to the present embodiment mainly includes the steps of forming a first electrode on a substrate, forming a light-absorbing layer on the first electrode, forming a buffer layer on the light-absorbing layer, and forming a second electrode on the buffer layer.

In the method, the steps other than the step of forming a light-absorbing layer on the first electrode can be performed by any conventional method. For example, the step of forming a first electrode on a substrate can be performed by a sputtering method using nitrogen as a sputtering gas, and forming a film layer such as an Mo layer. The buffer layer can be formed as a CdS layer by, for example, a chemical bath deposition method. The second electrode can be formed as a transparent electrode using an appropriate material.

In the formation of a light-absorbing layer, firstly, the aforementioned coating solution for forming a light-absorbing layer is applied to the first electrode (support). The application of the coating solution can be conducted by a spin-coat method, a dip-coat method, a doctor-blade (applicator) method, a curtain-slit cast method, a printing method, a spraying method or the like.

The application conditions can be appropriately selected depending on the desired film thickness, concentration of the materials and the like.

For example, in a spin-coating method, the support is set on a spin coater, followed by applying the coating solution to the support. The application conditions can be appropriately selected depending on the film thickness. For example, the application can be performed at a rotation speed of 300 to 3,000 rpm for 10 to 60 seconds.

In a dipping method, the support can be dipped in a container containing the coating solution. The dipping can be performed once, or a plurality of times.

After applying the coating solution for forming a light-absorbing layer on the support, a vacuum drying may be performed.

Subsequently, after applying the coating solution on the support, the support is baked to form a light-absorbing layer.

The baking conditions can be appropriately selected depending on the desired film thickness, type of materials used and the like. For example, the baking can be performed in 2 steps, namely, performing a soft bake on a hot plate (prebake), followed by baking in an oven (annealing).

In such a case, for example, the support may be set and held on a hot plate, followed by raising the temperature of the hot plate to 100 to 300° C. to perform the soft bake for 1 to 30 seconds. Then, the inside of the oven can be heated to 300 to 600° C., and maintained for 1 to 180 minutes to perform the annealing.

As a result, the light-absorbing layer is cured.

The baking temperatures described above are only one example of the baking conditions, and is not limited thereto. For example, the temperature of the hot plate can be raised in a stepwise manner, and the heating may be performed in an inert gas atmosphere in a glove box.

Thereafter, the film thickness of the light-absorbing layer is measured. When the film thickness is smaller than the desired thickness, the coating solution for forming a light-absorbing layer is applied to the support again and baked. By repeating these steps, a light-absorbing layer having the desired thickness can be obtained.

In the manner as described above, a chalcopyrite solar cell according to the present embodiment can be produced. Since the chalcopyrite solar cell produced by the method of the present embodiment contains no hydrazine in the coating solution, the safety of the production process can be improved. Further, since the coating solution for forming a light-absorbing layer exhibits improved storage stability, limitation on the production process can be reduced.

Second Embodiment

Next, the coating solution for forming a light-absorbing layer according to a second embodiment of the present invention will be described.

In the present embodiment, the coating solution for forming a light-absorbing layer is prepared from the hydrazine-coordinated Cu chalcogenide complex, the hydrazine-coordinated In chalcogenide complex and the hydrazine-coordinated Ga chalcogenide complex described above in the first embodiment, together with a hydrazine-coordinated Sb chalcogenide complex.

A hydrazine-coordinated Sb chalcogenide complex can be obtained by adding Sb selenide ($Sb_2Se_3$) and a chalcogen to hydrazine to obtain a crude product (a third crude product), extracting the crude product with DMSO, and adding a poor solvent to the resulting solution to perform recrystallization.

More specifically, Sb selenide and a chalcogen are added to hydrazine, and stirred at room temperature for about 3 to 7 days. Then, hydrazine is removed from the resulting solution while flowing nitrogen to obtain a crude product. Thereafter, the obtained crude product is extracted with DMSO.

Subsequently, the extraction solution obtained by extracting the crude product is subjected to filtration using, for example, a 0.2 μm PTFE filter. Then, a poor solvent is added to the filtrate for reprecipitation, thereby obtaining a black hydrazine-coordinated Sb chalcogenide complex.

The generation of the hydrazine-coordinated Sb chalcogenide complex described above can be expressed by a chemical formula (4) shown below.

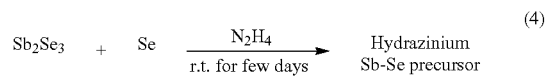

(4)

As the chalcogen, Se or S can be used, and Se is preferable. As the poor solvent, an alcohol solvent is preferable, and IPA is more preferable. As hydrazine, anhydrous hydrazine may be used, although hydrazine monohydrate is preferable. With respect to the amount of Sb selenide ($Sb_2Se_3$) and the chalcogen, it is preferable to use 2 mol or more of the chalcogen, per 1 mol of Sb selenide.

Although the present embodiment is described using Sb selenide, an elemental antimony may also be used instead of Sb selenide. In such a case, with respect to the amount of antimony (Sb) and the chalcogen, it is preferable to use 4 mol or more of the chalcogen, per 1 mol of antimony.

Next, the method of producing the coating solution for forming a light-absorbing layer according to the present embodiment will be described.

Firstly, DMSO is added to the hydrazine-coordinated Cu chalcogenide complex described in the first embodiment and stirred at room temperature for about one night, thereby obtaining a DMSO solution having the hydrazine-coordinated Cu chalcogenide complex dissolved therein (solution (I')).

Further, DMSO is added to the hydrazine-coordinated In chalcogenide complex and the hydrazine-coordinated Ga chalcogenide complex described in the first embodiment, and stirred at a temperature of 80 to 120° C. for about 1 hour, thereby obtaining a DMSO solution having the hydrazine-coordinated In chalcogenide complex and the hydrazine-coordinated Ga chalcogenide complex dissolved therein (solution (II')).

Furthermore, DMSO is added to the aforementioned hydrazine-coordinated Sb chalcogenide complex, and stirred at room temperature for one night, thereby obtaining a DMSO solution having the hydrazine-coordinated Sb chalcogenide complex dissolved therein.

In addition, 2 equivalents of Se is added to $Na_2Se$, and stirred in DMSO at room temperature for 3 to 7 days, thereby obtaining a uniform solution.

In the present embodiment, Na is used for improving the film quality of the light-absorbing layer (e.g., grain size and crystalline quality), and this Na solution may not be used.

Subsequently, the aforementioned 4 solutions, namely, the DMSO solution having the hydrazine-coordinated Cu chalcogenide complex dissolved therein, the DMSO solution having the hydrazine-coordinated In chalcogenide complex and the hydrazine-coordinated Ga chalcogenide complex dissolved therein, the DMSO solution having the hydrazine-coordinated Sb chalcogenide complex dissolved therein and the Na solution are mixed together.

In this manner, the coating solution for forming a light-absorbing layer according to the present embodiment can be produced.

Like in the first embodiment, the coating solution for forming a light-absorbing layer according to the present embodiment is not deteriorated with time, and exhibits excellent storage stability.

Further, since the coating solution itself does not contain hydrazine, the chemical properties (explosiveness) of hydrazine in the formation of a light-absorbing layer would not be of any problems, thereby improving the safety of the production process.

In addition, since the coating solution for forming a light-absorbing layer according to the present embodiment contains no amines as a dissolution promoter, the PV performance is improved as compared to conventional coating solutions.

Hereinabove, the present invention has been explained based on the aforementioned embodiments. Needless to say, the present invention is not limited to the aforementioned embodiments, and various modifications can be made without departing from the spirit or scope of the present invention.

For example, in the aforementioned embodiments, although the hydrazine-coordinated Cu chalcogenide complex is obtained by dissolving Cu and a chalcogen in DMSO having hydrazine added thereto, and adding a poor solvent to the resulting solution for recrystallization, the present invention is not limited thereto, and any hydrazine-coordinated Cu chalcogenide complex may be used. It would be satisfactory as long as DMSO having a hydrazine-coordinated Cu chalcogenide complex dissolved therein is ultimately prepared. For example, Cu and a chalcogen may be dissolved in DMSO having hydrazine dissolved therein, and the remaining hydrazine may be removed, so as to use the resulting solution.

Nevertheless, the hydrazine-coordinated Cu chalcogenide complex obtained by recrystallization as described in the aforementioned embodiments exhibits excellent solubility in DMSO. Therefore, by using this complex, a coating solution for forming a light-absorbing layer with a high precision can be obtained as compared to the conventional methods.

EXAMPLES

As follows is a description of examples of the present invention, although the scope of the present invention is by no way limited by these examples.

Example 1

In Example 1, a coating solution for forming a light-absorbing layer was produced in the same manner as described in the second embodiment.

Specifically, the coating solution was produced as follows. Firstly, a Cu metal (383.0 mg, 6.03 mmol) and 4 equivalents of Se (1,903.2 mg, 24.10 mmol) were added to DMSO (10 ml) having 2 equivalents (per 1 equivalent of Cu metal) of hydrazine anhydride (378 μl, 12.05 mmol) added thereto, and stirred for 3 days to dissolve the added contents. Then, the remaining hydrazine was removed from the resulting solution while flowing nitrogen, and the solution was then subjected to filtration using a 0.2 μm PTFE filter. Thereafter, IPA (total of 20 ml) was gradually added to the filtrate to perform recrystallization, thereby obtaining a black hydrazine-coordinated Cu—Se chalcogenide complex (2,424 mg).

Separately from the above, In selenide (964.9 mg, 2.07 mmol) and 1 equivalent of Se (1,645.2 mg, 2.07 mmol) were added to hydrazine anhydride (5 ml), followed by stirring at room temperature for 3 days. Then, the remaining hydrazine was removed from the resulting solution while flowing nitrogen to obtain a crude product. Subsequently, the crude product was extracted with DMSO, and the extraction solution was subjected to filtration using a 0.2 μm PTFE filter, followed by concentration. Thereafter, IPA was added to the concentrated solution, followed by stirring to precipitate a dark-red product. Then, supernatant was removed, and the precipitate was washed with IPA and dried, thereby obtaining a dark-red hydrazine-coordinated In—Se chalcogenide complex (838.2 mg).

Separately from the above, a Ga metal (418.3 mg, 6.00 mmol) and 2 equivalents of Se (947.5 mg, 12.00 mmol) were added to hydrazine anhydride (5 ml), followed by stirring at room temperature for 1 week. Then, the remaining hydrazine was removed from the resulting solution while flowing nitrogen to obtain a crude product. Subsequently, the crude product was extracted with DMSO, and the extraction solution was subjected to filtration using a 0.2 μm PTFE filter, followed by concentration. Thereafter, IPA (20 ml) was added to the concentrated solution, followed by stirring to precipitate a brownish product. Then, supernatant was removed, and the precipitate was washed with IPA and dried, thereby obtaining a dark-brown hydrazine-coordinated Ga—Se chalcogenide complex (428.7 mg).

Next, the hydrazine-coordinated Cu—Se complex, the hydrazine-coordinated In—Se complex and the hydrazine-coordinated Ga—Se complex were dissolved in DMSO to produce a coating solution for forming a light-absorbing layer.

The coating solution was adjusted to a CIGS/DMSO solution having a concentration of 0.3 mol/l, and the mixing molar ratio was adjusted to Cu/(In+Ga)=0.92, In/(In+Ga)=0.72, and Ga/(In+Ga)=0.28.

Further, the amount of Sb was adjusted to Sb/(Cu+In+Ga)×100=0.1 mol %, and the amount of Na was adjusted to Na/(Cu+In+Ga)×100=0.05 mol %.

Application of the coating solution was performed by a spin-coating method, and the baking was performed by conducting a soft bake at 300° C. for 5 minutes, followed by annealing at 540° C. for 5 minutes.

A solar cell was produced so that an Mo layer, a CIGS layer (light-absorbing layer), a CdS layer, an i-ZnO layer, an ITO layer, an Al layer, an Ni layer and an $MgF_2$ layer were laminated on a substrate in this order.

The results of the device evaluation of the produced solar cell are shown in Table 1.

Example 2

In Example 2, a solar cell was produced in the same manner as in Example 1, except that hydrazine monohydrate was used instead of hydrazine anhydride. The results of the device evaluation of the produced solar cell are shown in Table 1.

Comparative Example 1

In Comparative Example 1, a hydrazine-coordinated Cu—Se complex, a hydrazine-coordinated In—Se complex and a hydrazine-coordinated Ga—Se complex were obtained as crude products without performing reprecipitation or recrystallization. The crude products were dissolved in a DMSO solution having monoethanolamine added thereto, thereby obtaining a coating solution for forming a light-absorbing layer.

The coating solution was adjusted to a CIGS-DMSO/monoethanolamine solution (3:1) having a concentration of 0.1 mol/l, and the mixing molar ratio was adjusted to Cu/(In+Ga)=0.92, In/(In+Ga)=0.72, and Ga/(In+Ga)=0.28.

Application of the coating solution was performed by a spin-coating method, and the baking was performed by conducting a soft bake at 170° C. for 5 minutes, a further soft bake at 190° C. for 5 minutes, followed by annealing at 490° C. for 30 minutes.

A solar cell was produced so that an Mo layer, a CIGS layer (light-absorbing layer), a CdS layer, an i-ZnO layer, an ITO layer, an Al layer, an Ni layer and an MgF$_2$ layer were laminated on a substrate in this order.

The results of the device evaluation of the produced solar cell are shown in Table 1.

Comparative Example 2

In Comparative Example 2, a hydrazine-coordinated Cu—Se complex, a hydrazine-coordinated In—Se complex and a hydrazine-coordinated Ga—Se complex were obtained as crude products without performing reprecipitation or recrystallization. Then, the crude products were added to a DMSO solution. However, the hydrazine-coordinated In—Se complex and the hydrazine-coordinated Ga—Se complex could not be satisfactorily dissolved in the DMSO solution, and compounds were deposited. As a result, a coating solution for forming a light-absorbing layer could not be produced.

| Evaluation conditions | Conversion efficiency (%) | FF (%) | Voc (mV) | Jsc (mA/cm2) | Rs (Ω) | Rsh (Ω) |
| --- | --- | --- | --- | --- | --- | --- |
| Ex. 1 | 6.03 | 56.5 | 417 | 25 | 7.7 | 502 |
| Ex. 2 | 6.22 | 59.2 | 476 | 22 | 8.2 | 509 |
| Comp. Ex. 1 | 0.21 | 36.7 | 0.193 | 3.022 | 67.4 | 305.3 |

In Table 1, "FF" indicates the fill factor, which is a value obtained by dividing the maximum power of the solar cell by (open circuit voltage×short-circuit current). Voc indicates the open circuit voltage, which is the voltage obtained when the terminal is opened during irradiation of light, i.e., the maximum voltage of the solar cell. Jsc indicates the short-circuit current, which is the current obtained when the terminal is short-circuited during irradiation of light, i.e., the maximum current of the solar cell. Rs indicates the series resistance, and Rsh indicates the shunt resistance.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The invention claimed is:

1. A method of producing a coating solution for forming a light-absorbing layer of a chalcopyrite solar cell, comprising:
dissolving Cu or Cu$_2$Se and a chalcogen in a solvent comprising dimethylsulfoxide and hydrazine to obtain a solution;
adding an alcohol solvent to the resulting solution to crystallize a hydrazine-coordinated Cu chalcogenide complex;
re-dissolving the crystallized hydrazine-coordinated Cu chalcogenide complex in dimethylsulfoxide to obtain a solution (I);
dissolving a hydrazine-coordinated In chalcogenide complex in dimethylsulfoxide to obtain a solution (II);
dissolving a hydrazine-coordinated Ga chalcogenide complex in dimethylsulfoxide to obtain a solution (III); and
mixing together the solution (I), the solution (II) and the solution (III).

2. The method according to claim 1, wherein the hydrazine-coordinated In chalcogenide complex is obtained by:
adding In or In$_2$Se$_3$ and a chalcogen to hydrazine to obtain a crude product;
extracting the crude product with dimethylsulfoxide; and
adding an alcohol solvent to the resulting solution.

3. The method according to claim 1, wherein the hydrazine-coordinated Ga chalcogenide complex is obtained by:
adding Ga and a chalcogen to hydrazine to obtain a crude product;
extracting the crude product with dimethylsulfoxide; and
adding an alcohol solvent to the resulting solution.

4. The method according to claim 1, wherein the chalcogen is sulfur or selenium.

5. A method of producing a coating solution for forming a light-absorbing layer of a chalcopyrite solar cell, comprising:
dissolving Cu or Cu$_2$Se and a chalcogen in a solvent comprising dimethylsulfoxide and hydrazine to obtain a solution;
adding an alcohol solvent to the resulting solution to crystallize a hydrazine-coordinated Cu chalcogenide complex;
re-dissolving the crystallized hydrazine-coordinated Cu chalcogenide complex in dimethylsulfoxide to obtain a solution (I');
dissolving a hydrazine-coordinated In chalcogenide complex and a hydrazine-coordinated Ga chalcogenide complex in dimethylsulfoxide to obtain a solution (II'); and
mixing together the solution (I') and the solution (II').

6. The method according to claim 5, wherein the chalcogen is sulfur or selenium.

7. The method according to claim 5, wherein the hydrazine-coordinated Ga chalcogenide complex is obtained by:
adding Ga and a chalcogen to hydrazine to obtain a crude product;
extracting the crude product with dimethylsulfoxide; and
adding an alcohol solvent to the resulting solution.

8. The method according to claim 6, wherein the hydrazine-coordinated In chalcogenide complex is obtained by:
adding In or In$_2$Se$_3$ and a chalcogen to hydrazine to obtain a crude product;
extracting the crude product with dimethylsulfoxide; and
adding an alcohol solvent to the resulting solution.

9. A method of storing a coating solution for forming a light-absorbing layer of a chalcopyrite solar cell, comprising:
producing the coating solution according to the method of claim 1; and
storing the coating solution for longer than two weeks without producing Cu$_2$—Se precipitates.

10. A method of storing a coating solution for forming a light-absorbing layer of a chalcopyrite solar cell, comprising:
producing the coating solution according to the method of claim 5; and
storing the coating solution for longer than two weeks without producing Cu$_2$—Se precipitates.

* * * * *